United States Patent
Kenkare et al.

(10) Patent No.: US 7,573,762 B2
(45) Date of Patent: Aug. 11, 2009

(54) ONE TIME PROGRAMMABLE ELEMENT SYSTEM IN AN INTEGRATED CIRCUIT

(75) Inventors: Prashant U. Kenkare, Austin, TX (US); Michael Zimin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/759,028

(22) Filed: Jun. 6, 2007

(65) Prior Publication Data
US 2008/0304347 A1 Dec. 11, 2008

(51) Int. Cl.
G11C 29/00 (2006.01)
(52) U.S. Cl. ............. 365/200; 365/201; 365/225.7
(58) Field of Classification Search ............ 365/200, 365/201, 225.7
See application file for complete search history.

(56) References Cited

U.S. PATENT DOCUMENTS

| | | | |
|---|---|---|---|
| 5,430,679 A | 7/1995 | Hiltebeitel et al. | |
| 5,745,011 A * | 4/1998 | Scott | 331/44 |
| 6,205,063 B1 | 3/2001 | Aipperspach et al. | |
| 6,249,465 B1 | 6/2001 | Weiss et al. | |
| 6,260,104 B1 | 7/2001 | Roohparvar | |
| 6,757,204 B2 | 6/2004 | Di Ronza et al. | |
| 6,813,735 B1 | 11/2004 | Kurihara et al. | |
| 6,940,765 B2 | 9/2005 | Kyung | |
| 7,286,000 B1 * | 10/2007 | Koo | 327/276 |
| 2004/0153900 A1 | 8/2004 | Adams et al. | |
| 2005/0004253 A1 | 1/2005 | Araki et al. | |
| 2005/0181546 A1 | 8/2005 | Madurawe | |
| 2006/0083095 A1 * | 4/2006 | Kim et al. | 365/225.7 |
| 2008/0065929 A1 * | 3/2008 | Nadeau-Dostie et al. | 714/5 |

OTHER PUBLICATIONS

International Search Report and Written Opinion correlating to PCT/US2008/064111 dated Sep. 25, 2008.

* cited by examiner

Primary Examiner—Hoai V Ho
Assistant Examiner—Kretelia Graham
(74) Attorney, Agent, or Firm—David G. Dolezal; Robert L. King

(57) ABSTRACT

A system with a repairable memory array having redundant memory cells to replace one or more defective memory cells that are detected after fabrication. The system also includes non memory array circuits having circuitry that may adjust one or more operating parameters such as operating current, operating voltage, resistance, capacitance, timing characteristics and an operating mode. A set of one time programmable elements can be used to selectively store information for modifying operating parameters and replacing the defective memory cells with redundant memory cells.

21 Claims, 5 Drawing Sheets

ONE TIME PROGRAMMABLE ELEMENT SYSTEM IN AN INTEGRATED CIRCUIT

BACKGROUND OF THE INVENTION

1. Field of the Invention

This invention relates in general to integrated circuits and more specifically to integrated circuits with one time programmable elements.

2. Description of the Related Art

One time programmable (OTP) elements such as fuses and PROM cells are utilized in integrated circuits for adjusting the circuitry after fabrication of an integrated circuit. For example, a programmable fuse may be used to adjust circuitry of an integrated circuit for specific conditions or correct for manufacturing defects.

One specific use of OTP elements is for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP elements allows independent optimization of the product functionality for each manufacturing facility.

As integrated circuit technology advances, integrated circuit features (e.g. transistor gate length) have been decreasing, thereby allowing for more circuitry to be implemented in an integrated circuit. One challenge with implementing OTP elements such as a fuse in an integrated circuit is that fuse size reduction has not advanced at nearly the same rate as the reduction in size of transistor features. Accordingly, fuses may require a greater relative portion of the integrated circuit as integrated circuit technology advances.

In some integrated circuits utilizing OTP elements, different circuits each include dedicated OTP elements for providing redundancy repair information to a memory array and for providing non redundancy information for non memory array circuits e.g. for trimming, tuning, and/or timing adjustments. For example, each configurable circuit of an analog circuit would include its own OTP elements for providing the ability to program that feature. Such a system requires that an integrated circuit include a greater total number of OTP elements than may be needed.

What is desired is an improved technique for implementing OTP elements in an integrated circuit including both memory array circuits and non memory array circuits. In addition, it is desired that a unified approach be used for implementing OTP element solutions for multiple classes of circuits including memory array circuits and non memory array circuits.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
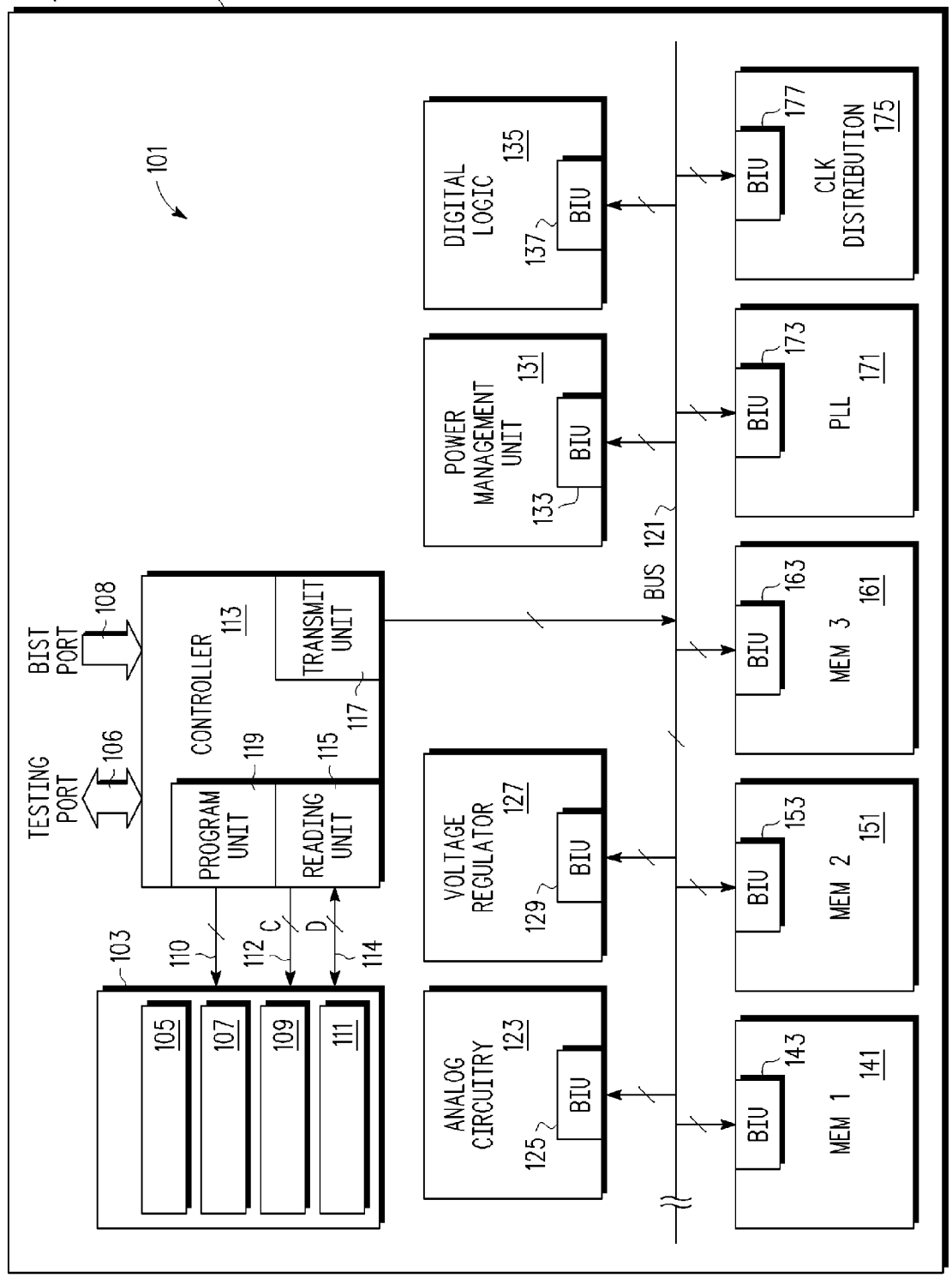
FIG. 1 is a block diagram of an OTP element system of an integrated circuit according to one embodiment of the present invention.

FIG. 1 is a block diagram of a fuse system of an integrated circuit 100. Fuse system 101 allows for the ability to utilize a programmable fuse among any one of a number of devices, thereby providing flexibility of the fuse system in an integrated circuit. Integrated circuit 100 can also include other fuse systems similar to fuse system 101. Each of these systems can be associated with either memory array circuits or non memory array circuits, or a combination of memory array and non memory array circuits.

System 101 includes a fuse array circuit 103 that includes a plurality of fuse banks with fuse banks 105, 107, 109, and 111 shown in FIG. 1. System 101 includes a fuse controller 113. Fuse controller 113 includes program unit 119 for programming the fuses of fuse array circuit 103 via lines 110. Controller 113 includes a fuse reading unit 115 for reading the information stored in the programmed fuses of array circuit 103. Controller 113 also includes a transmit unit 117 for providing the information stored in the fuses of array circuit 103 to devices on bus 121. In one embodiment, program unit 119 is utilized for electrically programmable OTP elements as opposed to non electrically programmable OTP elements such as laser programmable fuses.

Controller 113 includes a testing port 106 and a Built in Self Test (BIST) port 108 for accessing fuse system 101. Testing port 106 can be accessed externally using multiple approaches including scan. Built in Self Test port 108 may be controlled by on-chip Built in Self Test engines used for testing either the memory array circuits or non memory array circuits. For non electrical OTP implementations, both ports may be used for validation of the repair solution prior to actual programming using the non electrical means such as laser programming. For electrical OTP implementations, the test port 106 may be used for a non automated approach that requires control external to the system. The Built in Self Test port 108 may be used for providing programming information in an automated manner without external intervention. Such a use of Built in Self Test port 108 can also be referred to as self-programming.

System 101 includes a number of circuits of integrated circuit 100 that utilize the information stored in the programmed fuses of fuse array circuit 103 (fuse information). For example, system 101 includes three memory array circuits 141, 151, and 161 that are used to store information for the operation of the integrated circuit 100. Examples of memory array circuits may include SRAM memories, DRAM memories, and non volatile memories (e.g. Flash, MRAM). Such memory array circuits may be utilized as main memory, a cache memory, or as boot up memory for integrated circuit 100 or for a system implementing circuit 100. Memory array circuits 141, 151, and 161 utilize the fuse information for implementing redundant memory locations (e.g. rows, columns, blocks, or bits) as replacement locations for defective locations of a memory array. The fuse information for repairing a defective memory array typically includes encoded addresses for identifying either defective columns or rows, and an enable signal which indicates that the defective column or row is to be replaced by a redundant column or row.

Memory array circuits include the memory cells contained within one or more memory arrays and control circuitry which controls various timing signals required for either reading or writing the memory cells. As an example, these timing signals may control timing behavior of bit line pre-charge, word line duration, sense-amplifier enable, sense-amplifier pre-charge, and write duration. Each of these operating parameters are affected by processing and can be potentially controlled after fabrication using fuses. Other possible uses of fuses for post-fabrication operating parameter optimization of memory array circuits include adjustment of memory configuration, power-saving modes, reference voltages, sense differential voltages, bit line keeper strengths, and timing control of input or output latching structures. In some embodiments, only a small fraction of memory array circuits are expected to require post-fabrication redundancy-based repair or optimization of control circuitry. Hence, it is very desirable to have flexible usage of fuses across memory array circuits especially as it pertains to usage for redundancy-based repair and optimization of timing signals and voltage levels.

Each memory array circuit 141, 151, and 161 includes a bus interface unit (BIU) respectively 143, 153, and 163 for receiving fuse information from bus 121.

System 101 includes a phase lock loop circuit 171 having a BIU 173 for receiving fuse information from bus 121. Circuit 171 includes a phase lock loop (not shown) that utilizes the received fuse information for adjusting timing and tuning operating parameters of the phase lock loop. Examples of such operating parameters include selection of a Voltage Controlled Oscillator circuit, adjustment of clock pulse edges, adjusting internal capacitances, modifying filter parameters, changing device conductances, and definition of clock divider values.

System 101 includes a clock distribution circuit 175 having a BIU 177 for receiving fuse information from bus 121. Clock distribution circuit 175 utilizes the fuse information for adjusting timing and tuning operating parameters such as to program clock generators distributed throughout integrated circuit 100 with a desired amount of delay. In some embodiments, a clock generator includes a multiplexer that allows a choice of predetermined delay values. The appropriate delay value is determined by the select signals to the multiplexer. These select signals can be controlled after fabrication using fuse information. Other uses of fuse information for this circuit includes balancing of clock trees by modification of parasitic loads or modification of device conductances.

System 101 includes analog circuit 123 having a BIU 125 for receiving fuse information from bus 121. Analog circuit 123 includes analog circuitry distributed throughout integrated circuit 100 that has circuitry (e.g. trimmable capacitor and resistors) that is programmable with the fuse information. Such information may be used for post-fabrication adjustment of operating parameters such as tracking of voltage levels, magnitude of voltage levels and currents, resistance values, capacitance values, inductance values, and timing delays in order to improve performance or precision of the analog circuit.

Voltage regulator circuit 127 includes a BIU 129 to receive fuse information from bus 121. Voltage regulator circuit 127 may include one or more voltage regulators (not shown). Voltage regulator circuit 127 uses the fuse information to adjust the regulated voltage provided by those regulators. In one embodiment, voltage regulator circuit 127 would use the fuse information to adjust reference voltages provided to the voltage regulators. In other embodiments, the voltage regulator circuit 127 can use fuse information for improvement of stability, noise immunity, and precision.

Power management circuit 131 includes a BIU 133 for receiving fuse information from bus 121. Power management circuit 131 includes power management circuitry that controls system power consumption. Typically, this includes control of system operating voltage, system frequency, and the ability to change operating modes such that system power is minimized. These operating parameters may potentially be modified after fabrication by fuse information.

Digital logic circuit 135 includes a BIU 137 for receiving fuse information from bus 121. Digital logic circuit 135 includes digital circuitry located in integrated circuit 100 that is programmable with the fuse information. Such fuse information may be used for modifying operating parameters of the circuit following fabrication. For example, fuse information may be used for post-fabrication replacement of defective circuits with redundant logic and for selective adjustment of keeper sizes in dynamic logic blocks following fabrication.

In one embodiment, fuse information is programmed in fuse array circuit 103 after manufacture via programming unit 119 of controller 113. In one embodiment, programming unit 119 is coupled to either internal BIST (Built-in Self-Test) engines using BIST port 108 or to an external control unit through test port 106. As a result, there are multiple possible approaches for controlling programming unit 119 and the programmability of fuse array circuit 103.

In some embodiments, during start up (e.g. a power on reset), the information in fuse array circuit 103 is provided on bus 121 by transmit unit 117 in data unit sized increments (e.g. 2, 4, 8, 12, 14, 16, 24, 32, 64 bits). Each BIU includes an identification number. If the identification number matches a particular identifier field of the data unit sized increment, then BIU provides the fuse information in the remaining portion of the data unit to its respective circuitry for configurations of the circuits.

Other one time programmable device systems may have other configurations. For example, other fuse systems may include multiple fuses where the memory array circuits would be on one bus and the other circuits could be on other buses. In such an embodiment, controller 113 may have additional transmit units 117. Also in other embodiments, other types of circuits or different numbers of the circuit types may receive fuse information in a fuse system. For example, other fuse systems may include twenty memory array circuits. Also in other embodiments, the different circuits shown in FIG. 1 may share a BIU. For example, in some embodiments, the power management circuit 131 and the voltage regulator circuit 127 may receive fuse information from the same BIU. Also in other embodiments, controller 113 may be coupled to additional fuse arrays similar to fuse array circuit 103. Also, in other embodiments, an integrated circuit 100 may include multiple fuse systems similar to fuse system 101.

Figure 2:
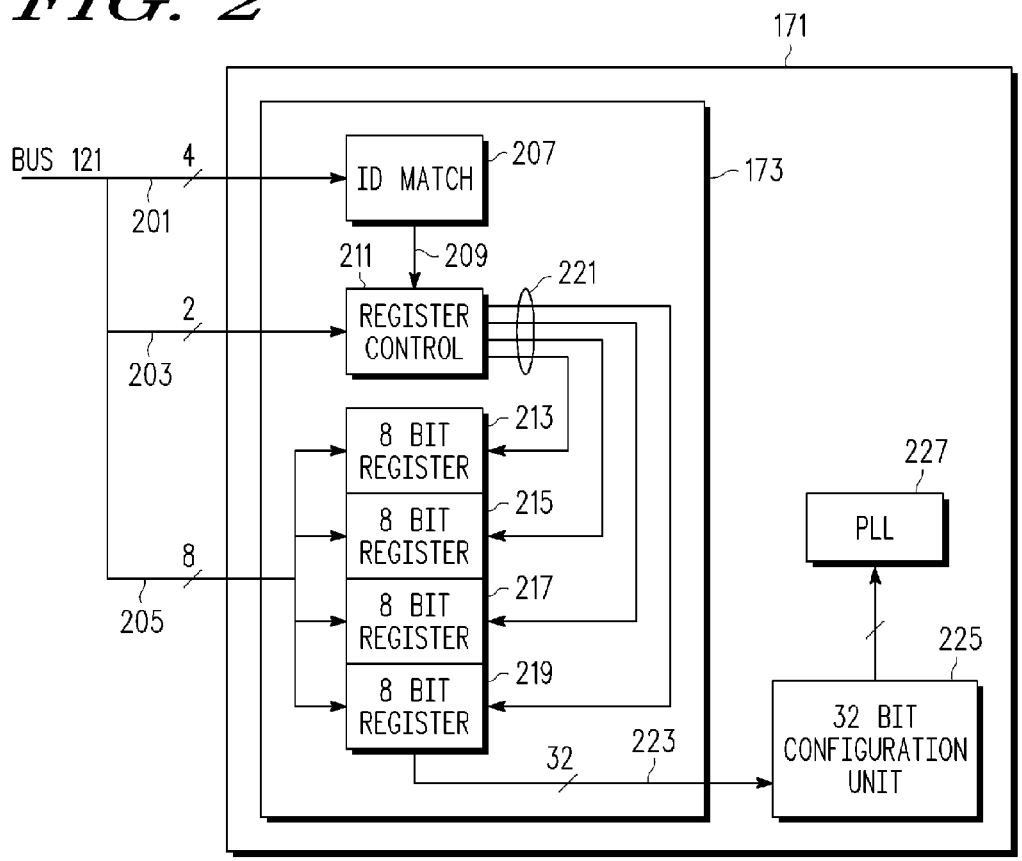
FIG. 2 is a block diagram of one embodiment of a circuit of FIG. 1 according to one embodiment of the present invention.

FIG. 2 is a block diagram of phase lock loop circuit 171. As shown in FIG. 2, circuit 171 includes a phase lock loop 227 and configuration unit 225. Unit 225 configures phase lock loop 227 for selection of a Voltage Controlled Oscillator circuit, adjustment of clock pulse edges, adjusting internal capacitances, modifying filter parameters, changing device conductances, and definition of clock divider values, or any other operating parameter related to adjusting tuning or timing. In one embodiment, unit 225 may include one or more pass gates or other switches that are controlled by the outputs of registers 213, 215, 217, and 219 of BIU 173 via lines 223.

In the embodiment shown, bus 121 is a 14 bit wide bus. Four bit lines 201 of the bus are connected to an ID match circuit 207 of BIU 173. Two lines 203 are connected to a register control circuit 211 of BIU 173. The eight remaining lines 205 are connected to each of 8 bit data registers 213, 215, 217, and 219. In the embodiment shown, bus 121 is a parallel digital bus. However, in other embodiments, bus 121 may have other configurations, e.g. serial, differential.

ID match circuit 207 includes a bus unique ID number. In the embodiment shown, the ID number is 4 bits wide. During a power on reset, when transmit unit 117 of controller 113 provides the fuse information on bus 121, if ID match circuit 207 detects that lines 201 match the unique ID number, ID match circuit 207 controls register control circuit 211 to load the 8 bits of information into one of the four registers 213, 215, 217, and 219, as per the two bits received on line 203 by the register control circuit 211. For example, if lines 203 provided a "01", then register control circuit 211 would load the information of lines 205 into register 215 by activating the write enable line of write enable lines 221 associated with that register.

In the embodiment shown, each register location of registers 213, 215, 217, and 219 represents a bit of configurable information for controlling 32 bit configuration unit 225.

In one embodiment, each bit of registers 213, 215, 217, and 219 includes a default value. If no fuse information is received by BIU 173 for that register, registers 213, 215, 217, and 219 would provide the default values to unit 225. When a register (213, 215, 217, and 219) is programmed with fuse information, then the fuse information is provided to unit 225 instead of the default values.

Accordingly, in some embodiments, only one or two bits of registers 213, 215, 217, and 219 would need to be programmed. In such a case, only those registers (213, 215, 217, and 219) containing the one or two bits would be written to with fuse information. The other non written registers of registers 213, 215, 217, and 219 would provide the default values.

In prior art systems, PLL circuit 171 would require 32 fuses, one for each of bit of registers 213, 215, 217, and 219. With such systems, if only one bit is needed to be adjusted, then the other 31 fuses would go unused. However, with the embodiments described herein, only the register (213, 215, 217, and 219) with the bit to be adjusted is written to. Thus, only 14 fuses (8 fuses for the data, four fuses for the ID match identifier, and two fuses for the information provided to lines 203 to register control circuit 211) of fuse array circuit 103 would be needed to program phase lock loop 227.

As shown by the above example, the fuse system of FIG. 1 enables fuses of fuse array circuit 103 to be shared by the circuits coupled to controller 113. With the system of FIG. 1, a fuse may be assigned to any circuit as needed. Accordingly, the number of fuses needed for programming integrated circuit 100 can be reduced over prior art fuse implementation schemes.

Other embodiments may include a different number of lines of bus 121. Also, other embodiments may include a different number of lines for lines 201, 203, and/or 205. In addition, other embodiments may implement different circuitry for programming a circuit using fuse information.

Figure 3:
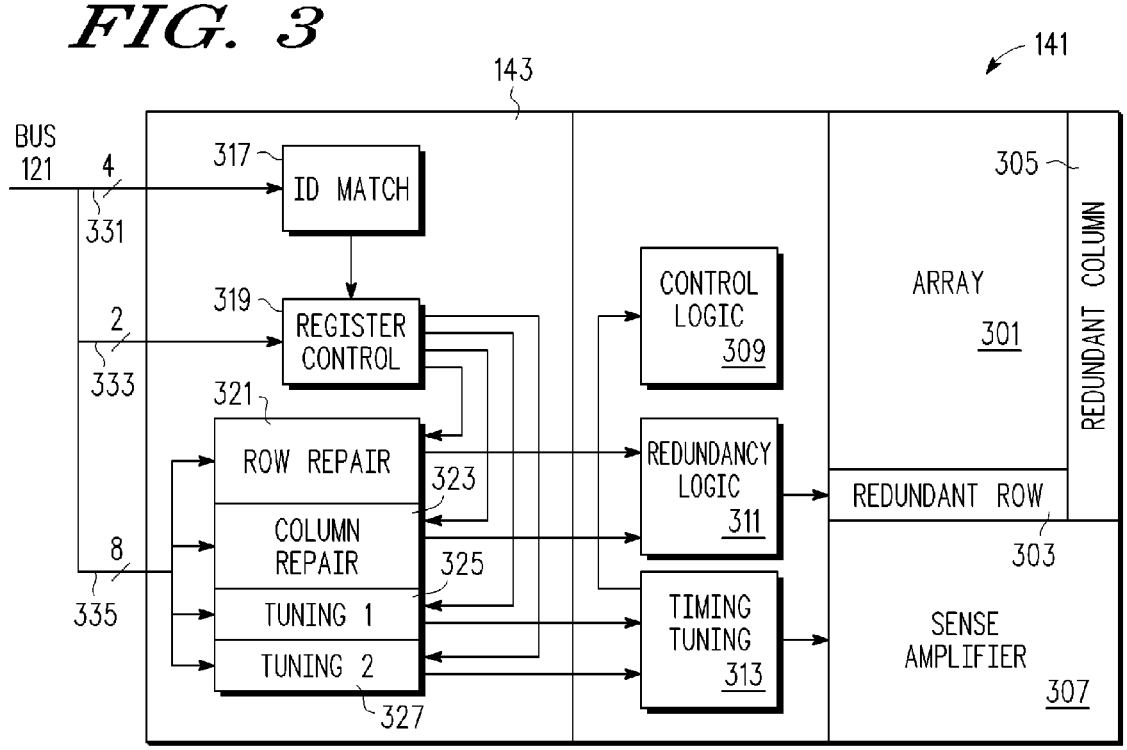
FIG. 3 is a block diagram of one embodiment of a circuit of FIG. 1 according to one embodiment of the present invention.

FIG. 3 is a block diagram of repairable memory array circuit 141. Memory array circuit 141 includes an array of memory cells 301 for storing information. Information in array 301 is written to and read from memory array 301 by providing addresses to control logic 309 and sense amplifier 307. Memory array circuit 141 is repairable in that it includes redundant cells, which in the embodiment shown, are implemented as redundant column 305 and redundant row 303, but may be implemented in different configurations in other embodiments. For example, the redundant cells may be implemented in a second array. Circuit 141 includes redundancy logic 311 for determining which column of array 301 is to be replaced with redundant column 305 and which row of array 301 is to be replaced with redundant row 303.

In one embodiment, redundancy logic 311 includes pass gates or other types of switches that are controlled by the information in row repair data register 321 and column repair data register 323. These switches are controlled such that addresses to the defective row or column of array 301 access the redundant row or column. In one embodiment, redundant row 303 replaces a row of array 301 which is identified by fuse information being written to register 321. Redundant column 305 replaces a column of array 301 which is identified by fuse information being written to register 323. If no fuse information is written to registers 321 and 323, then those registers will provide default values indicating that no replacement is needed. Fuse information used for programming the utilization of redundant cells in a memory array circuit is a type of redundancy information.

Operating parameters of memory array circuit 141 can also be adjusted by fuse information received on bus 121. As an example, timing signals may be adjusted to control timing behavior of bit line pre-charge, word line duration, sense-amplifier enable, sense-amplifier pre-charge, and write duration. Each of these behaviors are affected by processing and can be potentially controlled after fabrication using fuses. Other possible uses of fuses for post-fabrication operating parameter optimization of memory circuit 141 include adjustment of memory configuration, power-saving modes, reference voltages, sense differential voltages, bit line keeper strengths, and timing control of input or output latching structures. These parameters can be adjusted to correct for unforeseen design marginalities or unexpected process variation such that the desired memory operating performance is achieved. These adjustments are made by writing fuse information to one of register 325 or 327. The information in tuning registers 325 and 327 controls which parameters are adjusted. Registers 325 and 327 each provide default values if no fuse information is written to those registers.

BIU 143 includes an ID match circuit 317 that receives four lines of fuse information via lines 331. Register control circuit 319 receives two bits of fuse information via lines 333. Each of registers 321, 323, 325, and 327 are connected to lines 335 to receive 8 bits of information from bus 121.

ID match circuit 317 and register control circuit 319 operate in a similar way to write fuse information from lines 335 to one of registers 321, 323, 325, and 327 as ID match circuit 207 and register control circuit 211 operate to write information to registers 213, 215, 217, and 219.

In the embodiment shown, fuse information in fuse array circuit 103 can be used to repair both a row and a column of memory array 301. In one embodiment, a first fuse data unit is provide on bus 121 by unit 117 to write an indication of a defective row to register 321. Such a data unit would include an ID identifier on lines 331 indicating that the fuse information is intended for memory array circuit 141. The information on bus 121 also includes values on lines 333 indicating that register 321 is to be written with the fuse information from lines 335. Another data unit of fuse information would be placed subsequently on bus 121 indicating that the fuse information is intended for memory array circuit 141 and column repair register 323. In the event that the memory operating parameters need tuning, the tuning registers 325 and 327 can be written in a similar way as registers 321 and 323.

If no programming is needed on memory array circuit 141 during start up, then none of registers 321, 323, 325, or 327 would be written to with fuse information. Accordingly, those registers would provide default values.

As opposed to prior art integrated circuits, with the embodiment of FIG. 3, both redundancy repair and non redundancy repair fuse information can be provided to memory array circuit 141. Not only does this allow for fuses to be shared for redundancy repair and non redundancy repair information (e.g. timing and tuning information) of a particular memory circuit, but it allows for a fuse array to be used among the memory array circuits and other non memory array circuits (circuits 123, 127, 131, 135, 175, 171) of an integrated circuit. This ability to "share" fuses (or other types of OTP elements) among memory array and non memory array circuits may provide flexibility in fuse implementation. Such flexibility may ultimately reduce the number of fuses needed over prior art systems where fuse usage is not sharable. This is especially important in systems utilizing fuses in that that fuse size reduction has not advanced at nearly the same rate as the reduction in size of transistor feature size in integrated circuits.

In other embodiments, each memory circuit may includes multiple BIUs. For example, one BIU may be utilized for receiving redundancy fuse information, and the other BIU may be used for receiving non redundancy (e.g. timing, tuning) information.

Figure 4:
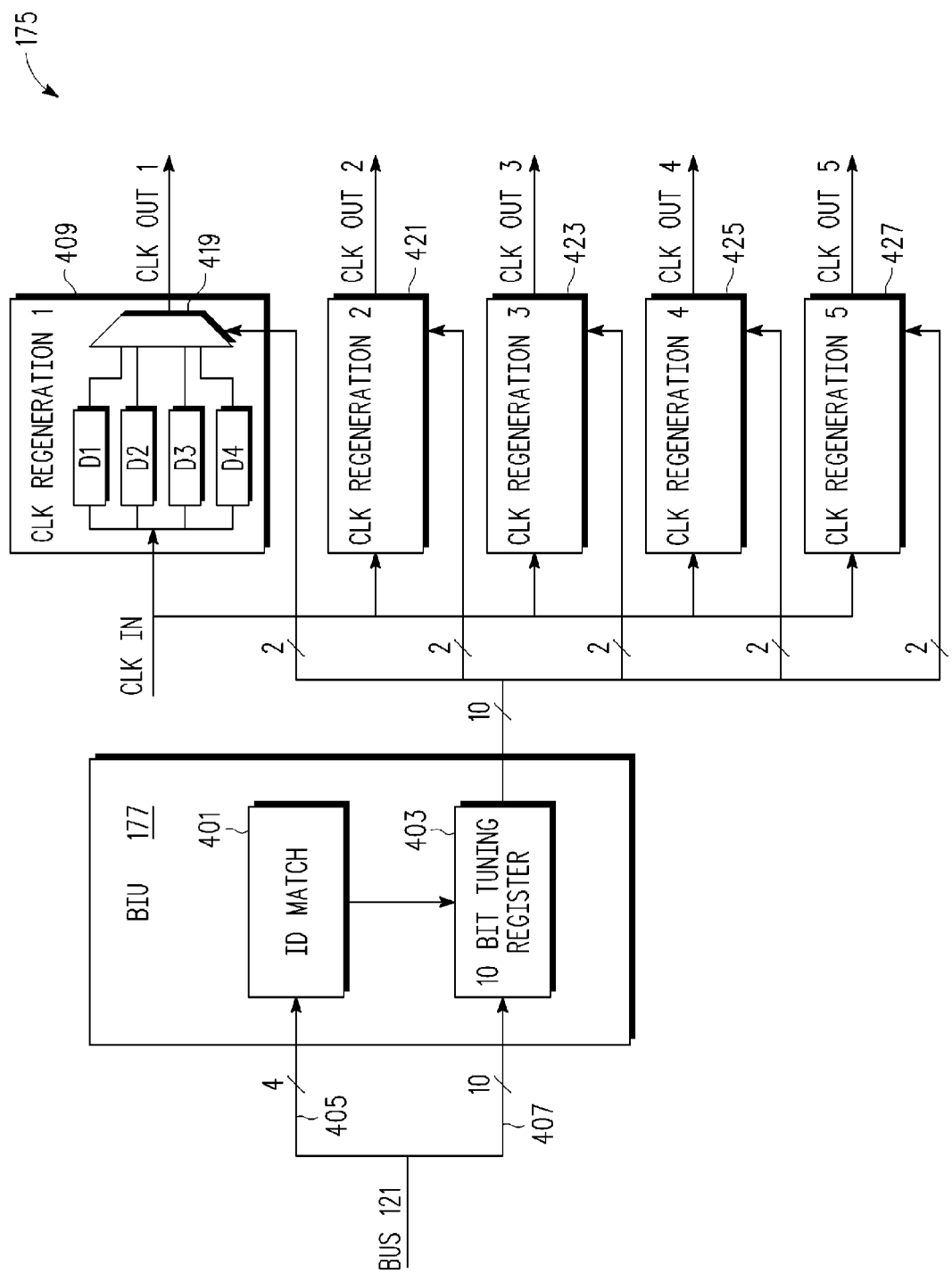
FIG. 4 is a block diagram of one embodiment of a circuit of FIG. 1 according to one embodiment of the present invention.

FIG. 4 shows a block diagram of one embodiment of clock distribution circuit 175. Clock distribution circuit 175 includes a plurality of clock regeneration circuits 409, 421, 423, 425, and 427 located throughout integrated circuit 100. Clock regeneration circuit 175 provides integrated circuit 100 with the ability to programmably delay a clock signal at various locations in integrated circuit 100.

Clock regeneration circuit 409 includes a multiplexer 419 and four different delay elements D1, D2, D3, and D4 each coupled to an input of multiplexer 419. Each delay element is coupled to a clock input. Each of the four delay elements has a different delay length. Depending upon which input of multiplexer 419 is selected, clock out 1 provides a clock signal with a different delay. Circuits 421, 423, 425, and 427 are configured in a similar way to circuit 409.

The multiplexer select input of each regeneration circuit (409, 421, 423, 425, and 427) is coupled to two bits of 10 bit tuning register 403. Thus, the delay provided by each clock generation circuit is programmable by writing fuse information to register 403 of BIU 177. In one embodiment, if no fuse information is written to register 403, then register 403 will provide default values.

BIU 177 is different from BIUs 143 and 173 in that it does not include a register control circuit (211, 319). Accordingly, in the embodiment shown, the two bits of fuse information that are provided to the register control circuits 211 and 319 with BIUs 143 and 173, can be used as programming data for configuring circuits. Accordingly, register 403 is ten bits whereas the registers of BIU 143 and BIU 173 are 8 bits. Writing to register 403 is controlled by ID match circuit 401.

Accordingly, in the embodiment shown, a system may be implemented where same length data units provided by controller 113 may include different sizes of programming information depending on how the BIU is implemented.

Figure 5:
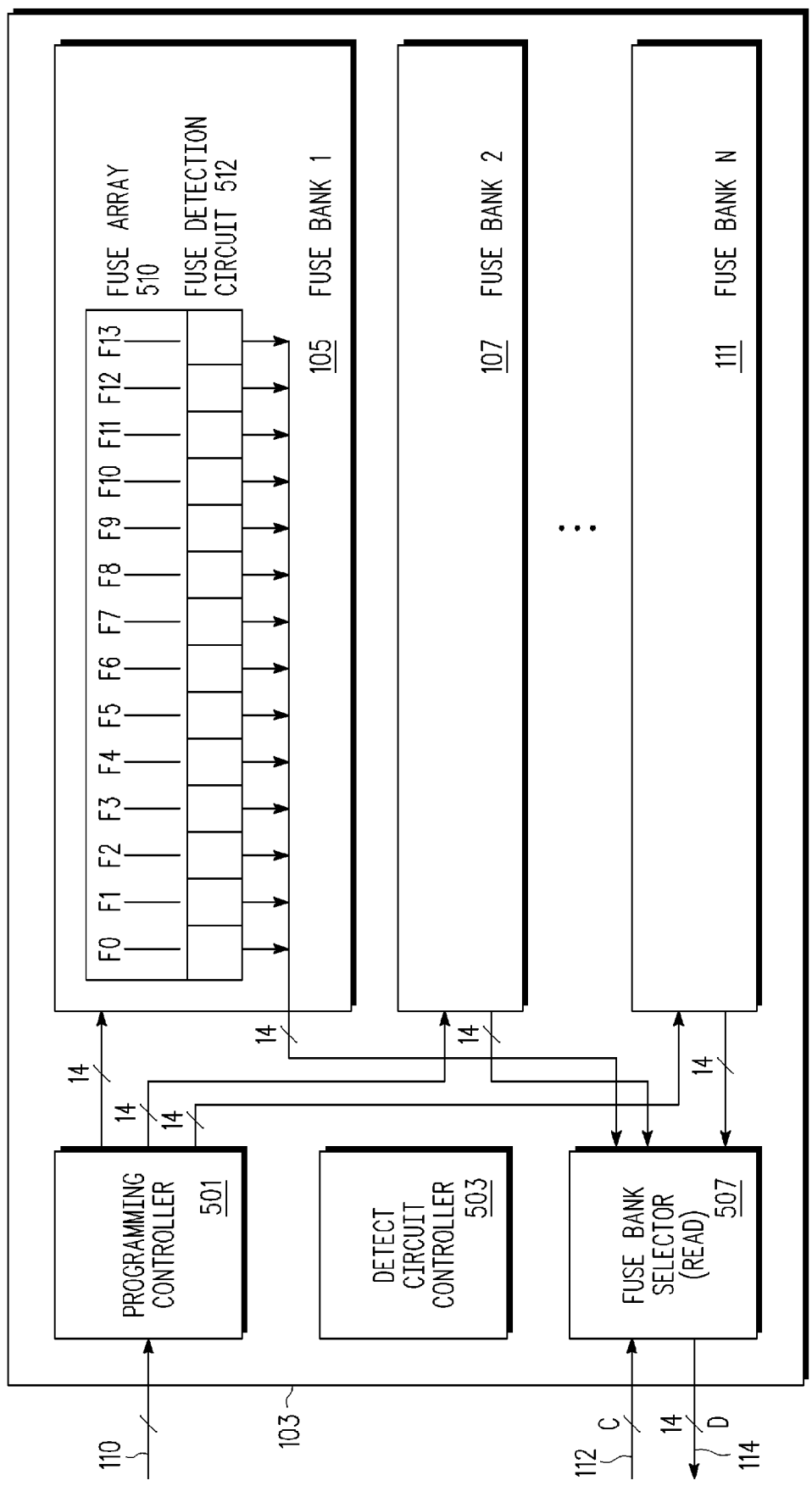
FIG. 5 is a block diagram of a fuse bank according to one embodiment of the present invention.

FIG. 5 shows a block diagram of fuse array circuit 103. Fuse array circuit 103 includes a number of fuse banks with fuse banks 105, 107, and 111. In the embodiment shown, each fuse bank includes a fuse array 510 of 14 fuses (F0-F13). Each fuse bank includes a fuse detection circuit 512 for determining the fuse state of each array. The fuse detection circuit 512 of each bank is coupled to a fuse bank selector 507. Fuse bank selector 507 is utilized to read the fuse information from each bank. In one embodiment, selector 507 provides the 14 bits from a bank on data (D) lines 114 in response to receiving a fuse bank address on control (C) lines 112.

Fuse array circuit 103 also includes a programming controller 501 for programming the fuses of the fuse banks. Fuse array circuit 103 also includes a detect circuit controller 503 that controls the fuse detection circuits 512 which detect the state of the fuses in the fuse banks.

In other embodiments, a fuse array circuit may have other configurations. Also, where other types of OTP elements (e.g. PROM cells) are utilized, circuits implementing those elements may have other configurations.

In one embodiment, upon a power on reset, controller 113 reads the information from each fuse bank by providing an address of the fuse bank on control lines 112 wherein the fuse information stored in the fuse bank is provided on data lines 114. Unit 117 of controller 113 then provides the fuse information on bus 121 as a 14 bit data unit. Each ID match circuit of a BIU of a circuit on bus 121 looks for the ID field in the data unit that matches its bus unique ID. If a BIU finds a match, then the fuse information on the bus is loaded in the registers of the BIU. Controller 113 keeps providing the information until all of the fuse information is provided on bus 121. In other embodiments, other controllers may provide the fuse information to the circuits on a bus by other methods.

Figure 6:
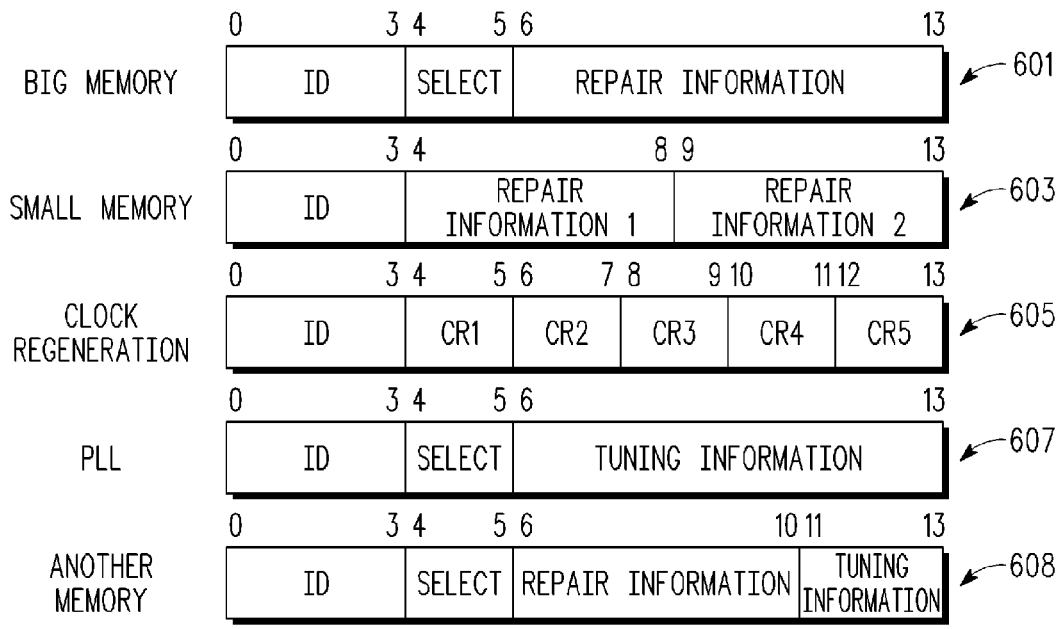
FIG. 6 is a diagram setting forth fuse fields of a fuse system according to one embodiment of the present invention.

FIG. 6 illustrates different fields of information that may be stored in different fuse banks of array circuit 103. As shown in FIG. 6, the system provides flexibility in having data programming fields of different lengths for programming different circuits.

Each of fields 601, 603, 605, 607, and 608 includes an ID sub field having an identifier used to identify the circuit on bus 121 in which the information is to be written. Accordingly, any bank of array 103 may be used for any circuit in system 101 by programming the bus unique ID (or system unique ID data in multiple bus systems) in the ID field. This ability to use a bank by a number of different circuits provides the circuit with flexibility to reduce the total number of fuses utilized.

Field 601 may be utilized for programming a large memory array circuit having a relatively large number of columns and rows. For example, the large memory array circuit could be similar to memory array circuit 141 shown in FIG. 3. With such a memory array circuit, the redundancy repair information needs to be a relatively large field to account for the large address. Field 601 includes a select subfield e.g. for designating whether the redundancy repair information is for a row or a column. In contrast, field 603 is utilized for a relatively smaller memory array circuit with a smaller number of rows and columns. With this memory array circuit, two different data fields (e.g. a redundant row and a redundant column) may be sent with one fuse data unit. Field 603 does not include a select field. Alternatively, field 603 can contain repair information for two separate memory array circuits.

Field 605 shows the fuse information for a clock distribution circuit (e.g. circuit 175). In this embodiment, each clock regeneration field is programmed with a specific subfield (e.g. CR1, CR2). Field 607 includes register select and timing information for PLL circuit 171.

Field 608 is utilized for programming a memory array circuit. Field 608 includes a subfield for redundancy repair information and a subfield for tuning information. Field 608 sets forth an example where both redundancy and non redundancy information may be provided by one data unit on bus 121.

Figure 7:
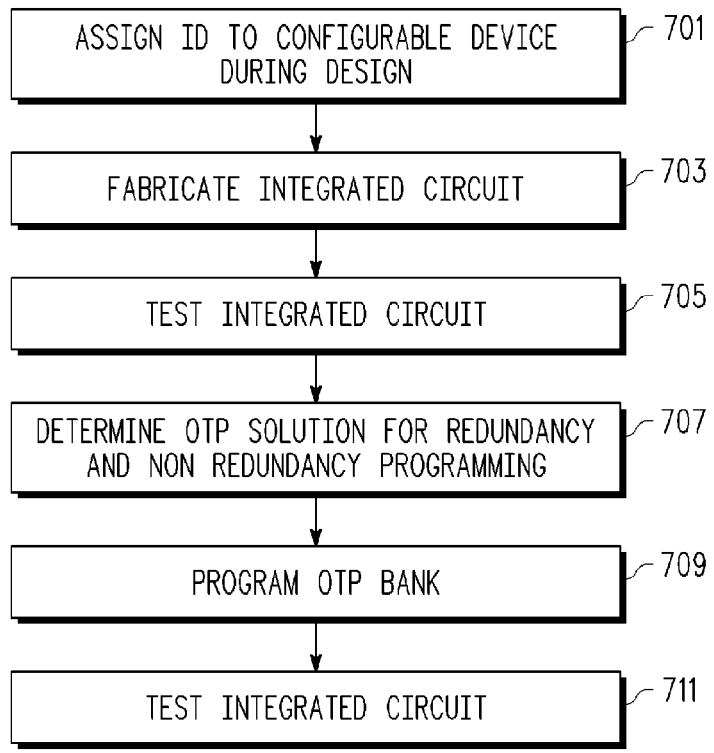
FIG. 7 is a flow diagram showing operations in the design and programming of a fuse system of an integrated circuit according to one embodiment of the present invention.

FIG. 7 is a flow diagram describing operations in designing, fabricating, testing, and programming the fuses of an integrated circuit.

In operation 701, during design, each circuit having configurable circuitry is designed to be coupled to bus 121 and is assigned a bus unique or system unique identification field. The match ID circuits (e.g. 207, 317, and 401) of each circuit is then designed to recognize the unique ID circuit transmitted on bus 121.

In operation 703, the integrated circuit is fabricated as per a design. In one embodiment, the integrated circuit is fabricated utilizing semiconductor processes. The integrated circuit is fabricated with the fuses in an unprogrammed state.

In operation 705, the integrated circuit is tested to determine whether configuration of any of the configurable circuits is needed or desired. In one embodiment, the memory arrays are tested for defective cells, defective columns, defective arrays, or defective blocks. Also, various tests are performed to determine the functionality and robustness of the different blocks on the integrated circuit. These could include (but are not limited to) measuring voltage regulator output, power consumption, PLL jitter, PLL frequency, clock skew characterization, analog circuit output levels, and frequency/voltage dependence of functional pattern performance.

In operation 707, a solution for programming the fuses with redundancy and non redundancy information is developed. This solution is based on the results of the testing in operation 705. In one embodiment, the respective registers of the BIUs that have bits which require programming are identified. The information is formulated for programming into each fuse bank to develop the ID subfield, the selection subfield (if needed) and all programming information not only for the bit or bits to be modified, but also for other bits of the same register. For example, if one bit of a register (e.g. 213, 403) of a BIU is to be modified, then default values of the other bits of that register are written to the other fuses. In this way, the registers of a BIU that are modified will provide default values for those bits where no modification is desired.

In operation 709, the fuse banks are programmed with the solution. In one embodiment, a fuse is programmed by allowing the fuse to remain intact to represent a first data state or by "blowing" the fuse to create an open or high impedance to represent a second data state. However, OTP elements may be programmed in other ways in other embodiments. In operation 711, the integrated circuit is tested again to ensure that the repair or adjustment was successful.

As shown above, the number of fuses utilized in an integrated circuit can be reduced where fuses can be utilized among different circuits. In one example, the number of fuses needed can be determined by determining every possible fuse needed on an integrated circuit and grouping those usages into subgroups wherein preferably the fuses in a subgroup are functionally related. It may be desirable to group the usages where if one usage needs to be changed, there is a relatively higher chance that the other usages of the group will be changed as well. In one embodiment, the number of fuses will be a small (<25%) fraction of the maximum possible usages pertaining to redundancy repair and non redundancy tuning, optimization or mode selection. In one embodiment, The number of fuse banks would be expected to be larger for an initial release of the product in an immature fabrication process. An advantage of the proposed solution is that the number of fuse banks can be modified between product revisions without changing other implementation details of the system.

Other processes for designing, fabricating, testing, and programming an integrated circuit of fuses may be utilized in other embodiments.

Examples of fuses that may be utilized in system 101 include polycide fuses, metal fuses, or laser programmable fuses. However, in other embodiments, other types of one time programmable elements may be utilized in place of the fuses such as programmable ROM (read only memory) cells e.g. electrically programmable ROMs.

In one embodiment, a system includes a memory array circuit including redundant memory cells for replacing defective memory cells detected after fabrication. The system also includes a non memory array circuit. The non memory array circuit includes circuitry for adjustment after fabrication of an operating parameter of a group consisting of an operating current, an operating voltage, a resistance, a capacitance, a conductance, an inductance, a frequency, a timing characteristic, a tuning characteristic, selection of one circuit from a set of circuits, and an operating mode. The system includes a one time programmable element. The one time programmable element is programmable for storing information for modifying the system after fabrication. The one time programmable element is programmably assignable after fabrication to any one of a group of circuits comprising the memory array circuit and the non memory array circuit. The one time programmable element is programmable to store information for any one of the group comprising replacing a defective memory cell of the memory array circuit detected after fabrication and adjusting after fabrication of the operating parameter of the non memory array circuit. The system includes control circuitry coupled to the one time programmable element to receive programmed information stored in the one time programmable element, the control circuitry is coupled to the memory array circuit and to the non memory array circuit to provide the programmed information stored in the one time programmable element to the one of the group of circuits that the one time programmable element is programmably assigned to.

In another embodiment, in an integrated circuit, a system includes one or more repairable memory array circuits that may be repaired with redundant memory cells after fabrication to replace one or more defective memory cells. The system also includes one or more non memory array circuits that may be adjusted after fabrication by modifying one or more operating parameters of the non memory array circuits. The system further includes a plurality of one time programmable elements that are programmable to be assigned to any of the one or more repairable memory array circuits for repairing the one or more defective memory cells with the redundant memory cells or assigned to any of the one or more non memory circuits for modifying the one or more operating parameters.

In another embodiment, a system includes a first circuit repairable after fabrication with redundant circuitry to replace defective circuitry as per programmed redundancy repair information. The system includes a second circuit adjustable after fabrication by modifying an operating parameter of the second circuit as per programmed adjustment information. The system further includes a plurality of sets of programmable fuses. Each set of the plurality is programmable to be assigned to any one of a group of circuits comprising the first circuit and the second circuit. The system further includes control circuitry coupled to the plurality of sets of programmable fuses to receive information from the plurality of sets of programmable fuses. The control circuitry coupled to the first circuit for providing to the first circuit programmed redundancy repair information from programmable fuses of the plurality of sets assigned to the first circuit and coupled to the second circuit for providing to the second circuit programmed adjustment information from programmable fuses of the plurality of sets assigned to the second circuit.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A system comprising:
   a memory array circuit comprising redundant memory cells for replacing defective memory cells detected after fabrication;
   a non memory array circuit, the non memory array circuit comprising circuitry for adjustment after fabrication of an operating parameter of a group consisting of an operating current, an operating voltage, a resistance, a capacitance, a conductance, an inductance, a frequency, a timing characteristic, a tuning characteristic, selection of one circuit from a set of circuits, and an operating mode;
   a one time programmable element, the one time programmable element programmable for storing information for modifying the system after fabrication, the one time programmable element is programmably assignable after fabrication to any one of a group of circuits comprising the memory array circuit and the non memory array circuit, wherein the one time programmable element is programmable to store information for any one of the group comprising replacing a defective memory cell of the memory array circuit detected after fabrication and adjusting after fabrication of the operating parameter of the non memory array circuit;
   control circuitry coupled to the one time programmable element to receive programmed information stored in the one time programmable element, the control circuitry is coupled to the memory array circuit and to the non memory array circuit to provide the programmed information stored in the one time programmable element to the one of the group of circuits that the one time programmable element is programmably assigned to.

2. The system of claim 1 further comprising:
   a bus, the control circuitry coupled to the memory array circuit and the non memory array circuit via the bus for providing information stored in the one time programmable element.

3. The system of claim 1 further comprising:
   a second one time programmable element, the second one time programmable element for storing information for programmably assigning the one time programmable element to one of the any one of the group of circuits.

4. The system of claim 1 wherein the one time programmable element is a fuse.

5. In an integrated circuit, a system comprising:
   one or more repairable memory array circuits that may be repaired with redundant memory cells after fabrication to replace one or more defective memory cells;
   one or more non memory array circuits that may be adjusted after fabrication by modifying one or more operating parameters of the non memory array circuits; and
   a plurality of one time programmable elements that are programmable to be assigned to any of the one or more repairable memory array circuits for repairing the one or more defective memory cells with the redundant memory cells or assigned to any of the one or more non memory circuits for modifying the one or more operating parameters.

6. The system of claim 5 further comprising:
   a bus coupled to the one or more repairable memory array circuits and to the one or more non memory array circuits; and
   control circuitry coupled to the plurality of one time programmable elements, the control circuitry coupled to the bus to provide information programmed in the plurality of one time programmable elements.

7. The system of claim 6 wherein the control circuitry provides the information from the plurality of one time programmable elements in data units, wherein the data units provided on the bus each include an identifier for identifying a specified one of the one or more non memory array circuits or of the one or more repairable memory array circuits that the data unit includes information for modifying.

8. The system of claim 7 wherein the identifier for each data unit is programmed in the plurality of one time programmable elements.

9. The system of claim 5 wherein each of the plurality of one time programmable elements is a fuse.

10. The system of claim 5 wherein the one or more non memory array circuits includes a clock circuit, wherein the one or more operating parameters include a specified delay of a plurality of delays of a clock line of the clock circuit.

11. The system of claim 5 wherein the one or more non memory array circuits includes a voltage regulator circuit, wherein the one or more operating parameters includes a regulated voltage level provided by a voltage regulator of the voltage regulator circuit.

12. The system of claim 5 wherein the one or more non memory array circuits includes a phase lock loop circuit, wherein the one or more operating parameters includes a tuning parameter or a timing parameter of a phase lock loop of the phase lock loop circuit.

13. The system of claim 5 wherein the one or more non memory array circuits includes a power management unit, wherein the one or more operating parameters include at least one of the group consisting of an operating mode of the power management unit, a system operating voltage, and a system frequency.

14. The system of claim 5 wherein the one or more operating parameters includes at least one of a group consisting of an operating current, an operating voltage, a resistance, a capacitance, a conductance, an inductance, and a timing characteristic.

15. The system of claim 5 wherein the one or more non memory array circuits includes at least one of a group consisting of an analog circuit and a digital logic circuit, wherein the one or more operating parameters of the group includes at least one of a group consisting of an operating parameter of digital logic of the digital logic circuit and an operating parameter of analog circuitry of the analog circuit.

16. The system of claim 5 wherein the plurality of one time programmable elements are programmable to be assigned to any of the one or more repairable memory array circuits for modifying one or more operating parameters of the one or more repairable memory array circuits.

17. A system comprising:
a first circuit repairable after fabrication with redundant circuitry to replace defective circuitry as per programmed redundancy repair information;
a second circuit adjustable after fabrication by modifying an operating parameter of the second circuit as per programmed adjustment information;
a plurality of sets of programmable fuses, each set of the plurality is programmable to be assigned to any one of a group of circuits comprising the first circuit and the second circuit;
control circuitry coupled to the plurality of sets of programmable fuses to receive information from the plurality of sets of programmable fuses, the control circuitry coupled to the first circuit for providing to the first circuit the programmed redundancy repair information from programmable fuses of the plurality of sets assigned to the first circuit and coupled to the second circuit for providing to the second circuit the programmed adjustment information from programmable fuses of the plurality of sets assigned to the second circuit.

18. The system of claim 17 wherein the first circuit further comprises a first repairable memory array circuit and the second circuit further comprises a second repairable memory array circuit.

19. The system of claim 17 wherein the first circuit further comprises a first repairable memory array circuit and the second circuit further comprises a non memory array circuit.

20. The system of claim 17 wherein each set of the plurality of sets of programmable fuses is programmable to store an identifier which identifies which one of the group of circuits comprising the first circuit and the second circuit that that the each set is assigned to.

21. The system of claim 17 further comprising:
a bus, wherein the control circuitry is coupled to the first circuit and the second circuit via the bus for communicating the programmed redundancy repair information and the programmed adjustment information.

* * * * *